United States Patent [19]

Nakayama

[11] Patent Number: 5,012,309
[45] Date of Patent: Apr. 30, 1991

[54] SEMICONDUCTOR MEMORY DEVICE COMPRISING CAPACITOR PORTIONS HAVING STACKED STRUCTURES

[75] Inventor: Akio Nakayama, Hyogo, Japan

[73] Assignee: Mitsubishi Denki Kabushiki Kaisha, Tokyo, Japan

[21] Appl. No.: 512,230

[22] Filed: Apr. 20, 1990

[30] Foreign Application Priority Data

Aug. 30, 1989 [JP] Japan .................................. 1-223417

[51] Int. Cl.$^5$ ..................... H01L 29/68; H01L 27/10; H01L 23/48
[52] U.S. Cl. ..................................... 357/23.6; 357/45; 357/68
[58] Field of Search ........................... 357/23.6, 45, 68

[56] References Cited

U.S. PATENT DOCUMENTS 4,651,183 3/1987 Lange et al. ...................... 357/23.6

FOREIGN PATENT DOCUMENTS 278363 11/1988 Japan ................................. 357/23.6
179449 7/1989 Japan ................................... 357/45

OTHER PUBLICATIONS

"A New Stacked Capacitor DRAM Cell Characterized by a Storage Capacitor on a Bit-line Structure", IEDM 1988, pp. 596-599 by Sin'ichiro Kimura, Yoshifumi Kawamoto, Tokuo Kure, Norio Hasegawa, Jun Etoh, Masakazu Aoki, Eiji Takeda, Hideo Sunami, and Kiyoo Itoh.

*Primary Examiner*—Rolf Hille
*Assistant Examiner*—Robert P. Limanek
*Attorney, Agent, or Firm*—Lowe, Price, LeBlanc, Becker & Shur

[57] ABSTRACT

A dynamic random access memory comprises a semiconductor substrate of a first conductivity type, a plurality of work lines, a plurality of bit lines, a plurality of active regions and a plurality of memory cells. The word lines extend in a first direction on a major surface of the semiconductor substrate. The bit lines are formed on the word lines and extend in a second direction intersecting with the first direction. The plurality of active regions are formed spaced apart at least at a predetermined interval in a third direction intersecting with the first and the second directions. Each of the active regions substantially forms a plane rectangle. The memory cells are arranged at intersection points of the word lines and the bit lines. Each memory cell comprises one and the other impurity regions of a second conductivity type, a gate electrode connected to the word lines, a storage node and a cell plate. The storage node is in contact with the other impurity region and is located above the bit line. An active region constituting a memory cell can be formed with a simple pattern layout related to lattices comprising word lines and bit lines without using a complicated pattern layout, in order to arrange the bit lines in an lower layer portion of a capacitor.

8 Claims, 12 Drawing Sheets

SEMICONDUCTOR MEMORY DEVICE COMPRISING CAPACITOR PORTIONS HAVING STACKED STRUCTURES

BACKGROUND OF THE INVENTION

1. Field of the Invention

The present invention relates generally to semiconductor memory devices, and more particularly to dynamic random access memories (referred to as DRAM hereinafter) comprising capacitor portions (stacked capacitor cell) having stacked structures.

2. Description of the Background Art

DRAM is already well known. FIG. 7 is a block diagram showing one example of an entire structure for a conventional DRAM.

Referring to FIG. 7, the DRAM comprises a memory cell array 1000 including a plurality of memory cells as storage portions, a row decoder 2000 and a column decoder 3000 connected to address buffers for selecting an address of a memory cell, and an input/output interface portion including sense amplifiers connected to an input/output circuit. The plurality of memory cells as the storage portions are provided in matrix of a plurality of rows and columns. Each memory cell is connected to a corresponding word line connected to the row decoder 2000 and to a corresponding bit line connected to the column decoder 3000, which constitutes the memory cell array 1000. As the row decoder 2000 and the column decoder 3000 respectively receive externally applied row address signal and column address signal to select a single word line and a single bit line for selecting a memory cell. Data is written into the selected memory cell or the data stored in the memory cell is read out. Instructions of the data writing/reading are given by a writing/reading control signal applied to a control circuit.

Data is stored in the memory cell array 1000 of N (=n×m) bits. Address information of a memory cell to which writing/reading is performed is stored in the row and the column address buffers, and memory cells of m bits are coupled to the sense amplifiers through bit lines by selecting a particular word line (selection of a single word line among n number of word lines) by means of the row decoder 2000. Then, one of the sense amplifiers is coupled to the input/output circuit by selecting a particular bit line (selection of a single bit line among m number of bit lines) by means of the column decoder 3000, whereby reading or writing is performed in accordance with instructions of the control circuit.

FIG. 8 is an equivalent circuit showing a memory cell 100 of a DRAM illustrated for explaining a writing/reading operation of a memory cell. According to the drawing, one memory cell 100 comprises a pair of a field effect transistor Q and a capacitor Cs. A gate electrode of the field effect transistor Q is connected to a word line 200, one of source/drain electrodes is connected to one electrode of the capacitor Cs, and the other of the source/drain electrodes is connected to a bit line 300. In data writing, the field effect transistor Q is rendered conductive by an application of a predetermined voltage to the word line 200, so that electric charges applied to the bit line 300 are stored in the capacitor Cs. On the other hand, in data reading, the field effect transistor Q is rendered conductive by the application of a predetermined voltage to the word line 200, so that the electric charges stored in the capacitor Cs are read out through the bit line 300.

FIG. 9 is a partial plan view showing a plane arrangement of a memory cell of a conventional DRAM. FIG. 10 is a sectional view taken along a line X—X of FIG. 9.

A structure and an operation of a conventional memory cell will be described in the following with reference to these drawings.

One memory cell is structured by an n channel MOS transistor and a capacitor formed on a major surface of a p type silicon substrate 1. The n channel MOS transistor comprises a gate electrode 7, and n+ impurity diffusion regions 4 and 5 which will be source and drain regions. The n+ impurity diffusion regions 4 and 5 are formed spaced apart from each other on the major surface of the p type silicon substrate 1 so as to define a channel region with a part of the major surface of the silicon substrate 1 serving as a channel surface. The gate electrode 7 is formed on the channel region through a gate oxide film 6. An active region 20 formed of the n+ impurity diffusion regions 4 and 5 and the channel region is isolated from the environment through an isolating field oxide film 3. A p+ impurity diffusion region 2 is formed under the field oxide film 3. The gate electrode 7 is formed as a word line. The capacitor is connected to the n+ impurity diffusion region 4 through a contact hole 17. The capacitor is formed of a storage node 8 connected to the n+ impurity diffusion region 4 and a cell plate 10 formed on the storage node 8 through a capacitor dielectric film 9. A bit line 12 is connected to the n+ impurity diffusion region 5 through a contact hole 16. An interlayer insulating film 11 is formed between the bit line 12, the word line 7 and the cell plate 10.

Writing operation using a memory cell structured as the foregoing will be described. First, in a writing operation of "1", a predetermined voltage is applied to the n+ impurity diffusion region 5 through the bit line 12. Then, the n channel MOS transistor is turned on by an application of a predetermined voltage to the gate electrode 7. With the bit line 12 being at the High level, electrons in the n+ impurity diffusion region 4 are drawn out to the n+ impurity diffusion region 5, raising a potential of the n+ impurity diffusion region 4 to be the same as that of the n+ impurity diffusion region 5. As a result, positive electric charges are stored in the storage node 8 connected to the n+ impurity diffusion region 4. This state is stored as the data "1" in the memory cell.

In writing operation of "0", the potential of the n+ impurity diffusion region 5 is set to the Low level. The n channel MOS transistor is turned on by an application of a predetermined voltage to the gate electrode 7. At this time, since the potential of the n+ impurity diffusion region 4 is higher than the potential of the n+ impurity diffusion region 5, electrons are injected from the n+ impurity diffusion region 5 to the n+ impurity diffusion region 4, causing the potential of the n+ impurity diffusion region 4 to fall. As a result, the positive electric changes are drawn out from the storage node 8. This state is stored as the data "0" in the memory cell.

The cell plate 10 usually has a potential ($\frac{1}{2}$) Vcc level if a power supply voltage is represented as Vcc. In a reading operation, a predetermined voltage is applied to the gate electrode 7 after the bit line 12 is applied to the ($\frac{1}{2}$) Vcc level, so that the n channel MOS transistor is turned on. As a result, the electric charges stored in the storage node 8 move to the bit line 12 through the n+ impurity diffusion regions 4 and 5. At this time, in a state where the data "1" is stored in the storage 8, a potential of ($\frac{1}{2}$) Vcc+α appears on the bit line 12, and in a state where the data "0" is stored, a potential of ($\frac{1}{2}$) Vcc−α appears on the bit line 12.

In recent years, as the manufacturing technique improves, attempts have been made in integrating and miniaturizing a memory cell of a DRAM semiconductor memory device. As a memory cell is more miniaturized, however, a capacity of each capacitor tends to be decreased. If the capacity of the capacitor is decreased, in the case of reading information stored in a memory cell, that is, when the bit line 12 is applied to a level of ($\frac{1}{2}$) Vcc beforehand, and a potential of the bit line 12 changes to a level of ($\frac{1}{2}$) Vcc±α according to the amount of electric charges stored in the storage node 8, a change α of the potential becomes smaller. Therefore, a reading margin for data is reduced, so that data is read out erroneously. Accordingly, it is preferable that the capacitor formed of the storage node 8, the capacitor dielectric film 9 and the cell plate 10 is formed so as to have a capacity as large as possible to obtain a larger reading margin.

In a memory cell having such structure as shown in FIG. 10, however, a plane area of the storage node 8 is limited due to the bit line 12. More specifically, in this structure, the thick interlayer insulating film 11 should be formed between the bit line 12 and the capacitor portion in order that the bit line 12 is formed in an upper layer portion of the capacitor portion formed of the storage node 8 and the cell plate 10. Therefore, a margin in a lateral direction is necessary between the cell plate 10 and the contact hole 16 through which the bit line 12 is connected to n+ impurity diffusion region 5, which limits a plane area of the storage node 8 according to the cell plate 10. Accordingly, it is difficult to increase a capacity of a capacitor.

In order to solve the above described problems, a memory cell of a DRAM having a stacked capacitor cell on a bit line has been proposed. FIG. 11 is a partly sectional view showing a memory cell of a DRAM having a stacked capacitor cell on a bit line described in "A New Stacked Capacitor DRAM Cell Characterized by a Storage Capacitor on a Bit-line Structure" IEDM (International Electron Devices Meeting) 1988, pp. 596–599. The memory cell has a structure of placing a bit line in a lower portion of a capacitor portion. FIG. 12 is a plan view thereof. FIG. 11 shows a section taken along a line XI—XI of FIG. 12. In the drawing, gate electrodes 7 which are also used as word lines are formed spaced apart through gate oxide films 6 on a silicon substrate 1. One and the other impurity diffusion regions 4 and 5 are formed spaced apart as source/drain regions through the gate electrodes 7. A bit line 12 is formed so as to be connected to the impurity region 5. The bit line 12 is formed so as to intersect with a word line 7. An interlayer insulating film 15 is formed between the word line 7 and the bit line 12. A storage node 8 is formed through the interlayer insulating film 11 above the bit line 12. The storage node 8 is formed so as to be electrically in contact with the impurity region 4. A cell plate 10 is formed so as to be opposed to the storage node 8 through a capacitor dielectric film 9. Since the bit line 12 is formed under the storage node 8 and the cell plate 10 as the capacitor portion, an active region 20 is disposed diagonal to the bit line 12 and the word line 7.

In the structure shown in FIG. 11, the storage node 8 and the cell plate 10 can be formed to extend above the contact portion at which the bit line 12 is connected to the impurity region 5. Therefore, a plane area of the capacitor portion can be enlarged, thus making it possible to increase a capacity of a capacitor.

The active region 20 has a complicated configuration as shown in FIG. 12 because of a structure of a bit line being under a stacked capacitor cell. More specifically, opposite end portions of the active region 20 have a configuration bent along a direction of the bit line. This means that a complicated pattern should be used in order to form an isolation region for isolating a plurality of active regions. Accordingly, a complicated pattern layout should be employed in order to structure a bit line embedded type stacked capacitor cell.

SUMMARY OF THE INVENTION

One object of the present invention is to form active regions in a semiconductor memory device having bit lines under stacked capacitor cells by using a simple pattern layout.

Another object of the present invention is to implement a memory cell layout of a high plane density in a DRAM comprising bit lines under stacked capacitor cells.

A further object of the present invention is to dispose active regions in a regular arrangement related to a lattice of word lines and bit lines in a DRAM having bit lines under stacked capacitor cells.

A semiconductor memory device according to the present invention comprises a semiconductor substrate of a first conductivity type, a plurality of word lines, a plurality of bit lines, a plurality of active regions and a plurality of memory cells. The semiconductor substrate comprises a major surface. The word lines are formed on the major surface and extend in a first direction. The bit lines are formed on the word lines and extend in a second direction intersecting with the first direction. The active regions are formed spaced apart on the major surface of the semiconductor substrate at at least a predetermined interval in a third direction intersecting with the first and second directions. Each of the active regions substantially forms a plane rectangle. The memory cells are arranged at intersections of the word lines and the bit lines.

Each memory cell includes one and the other impurity regions of a second conductivity type, a gate electrode, a storage node and a cell plate. The impurity regions are formed spaced apart from each other in the active region so as to define a channel region with a part of the major surface being a channel surface. The gate electrode is formed on the channel surface through a gate insulating film and is connected to be contiguous to the word line. The bit line is formed insulated above the gate electrode so as to be in electrically contact with one impurity region. The storage node is in electrical contact with at least the other impurity region and is located above the bit line. The cell plate is formed on the storage node through a dielectric film.

In the present invention, a storage node constituting a stacked capacitor is formed to be located above a bit line. An active region is formed to be arranged in a direction intersecting with directions of a bit line and a word line. The active region substantially forms a plane rectangle. Therefore, by forming a part of the stacked capacitor in an upper layer portion of the bit line, a capacity of the capacitor can be increased and the active region electrically connected to the capacitor can be formed with a simple pattern layout. Accordingly, there will be no need to provide an active region having a complicated pattern layout related to a lattice pattern of bit lines and word lines, in order to form a bit line in a lower layer portion of a capacitor portion.

According to a preferred embodiment of the present invention, a semiconductor memory device comprises an insulating layer formed on bit lines and word lines having a concave opening including a bottom surface exposing at least a surface of the other impurity region and a side surface extending approximately perpendicular to a major surface of a semiconductor substrate. A storage node may include a portion extending in a region surrounded by the word line and the bit line. The storage node may comprise a contact portion electrically in contact with the other impurity region in the extended portion. The contact portion is arranged in a first direction or a second direction. Active regions comprise a group of active regions arranged in one direction or two directions intersecting with each other.

As the foregoing, according to the present invention, an active region constituting a memory cell can be formed with a simple pattern layout in order to arrange bit lines in a lower layer portion of a capacitor portion. Therefore, an active region having a regular pattern layout related to a lattice of bit lines and word lines can be formed. As a result, in a memory cell of an open bit line structure, a memory cell layout having a high density can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
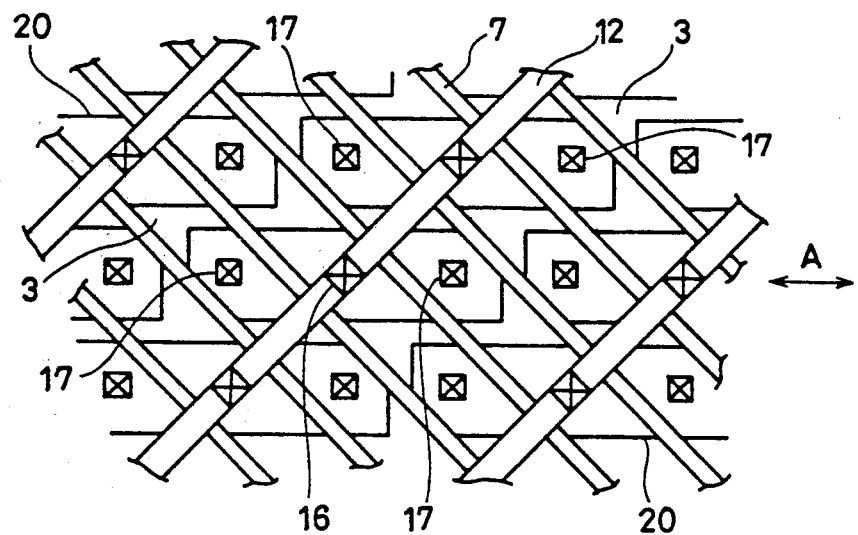
FIG. 1 is a partial plan view showing one example of a plane arrangement of memory cells of a DRAM as a semiconductor memory device according to the present invention.
Figure 2:
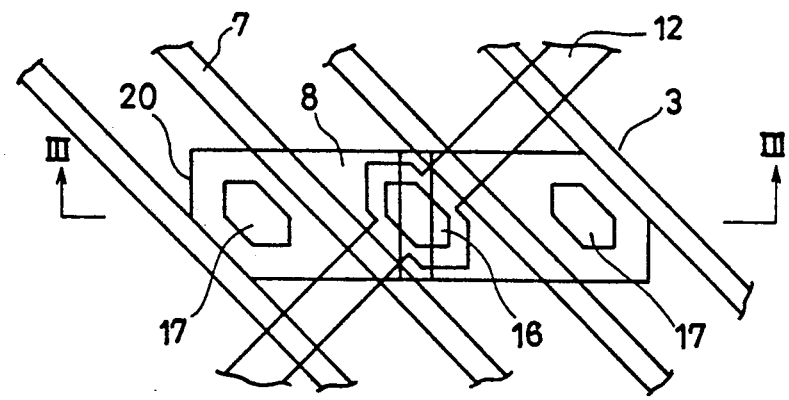
FIG. 2 is a partial plan view showing a plane structure of one memory cell in FIG. 1.
Figure 3:
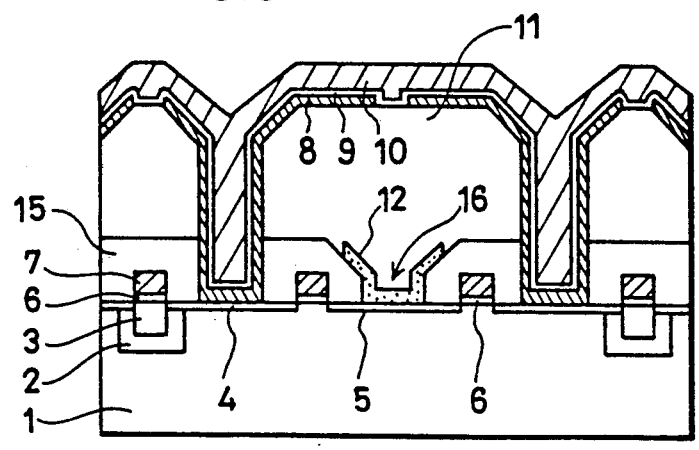
FIG. 3 is a sectional view showing a section taken along a line III—III of FIG. 2.

One embodiment of the present invention will be described with reference to the drawings in the following. Referring to FIG. 1, a plane arrangement of the memory cells is in accordance with an open bit line structure. The open bit line structure is one of layout systems of bit lines in a DRAM, wherein a pair of bit lines connected to one sense amplifier are arranged opposing to each other with the sense amplifier provided therebetween. Referring to FIGS. 2 and 3, a plurality of bit lines 12 and word lines 7 are arranged to intersect with each other. Active regions 20 are formed spaced apart at a predetermined interval in a direction shown by an arrow A which intersects the bit lines 12 and the word lines 7. Each of the active regions 20 substantially forms a plane rectangular. The active regions 20 are electrically isolated from each other through isolation field oxide films 3. $p^+$ impurity diffusion regions 2 are formed as inversion prevention layers under the field oxide films 3.

Each memory cell is arranged at a point where a word line 7 and a bit line 12 intersect with each other. One memory cell comprises an n channel MOS transistor and a capacitor formed on a major surface of a p type silicon substrate 1. The n channel MOS transistor comprises a gate electrode 7 which is contiguous as a word line, and $n^+$ impurity diffusion regions 4 and 5 which will be source and drain regions. The $n^+$ impurity diffusion regions 4 and 5 are formed spaced apart on the major surface of the p type silicon substrate 1 so as to define a channel region with a part of the major surface of the silicon substrate 1 being as a channel surface. The gate electrode 7 is formed on the channel region through a gate oxide film 6. A capacitor is connected to the $n^+$ impurity diffusion region 4. The capacitor is formed of a storage node 8 connected to the $n^+$ impurity diffusion region 4 and a cell plate 10 formed covering the storage node 8 through a capacitor dielectric film 9. The bit line 12 is connected to the $n^+$ impurity diffusion region 5 through a contact hole 16. The storage node 8 is formed along an inner surface of a contact hole 17 formed in an interlayer insulating film 11, and connected to the $n^+$ impurity diffusion region 4. An interlayer insulating film 15 is formed on the word line 7. The interlayer insulating film 11 is formed on the bit line 12. The storage node 8 is formed extending on the interlayer insulating film 11. Therefore, the storage node 8 is disposed also above the bit line 12.

Figure 4:
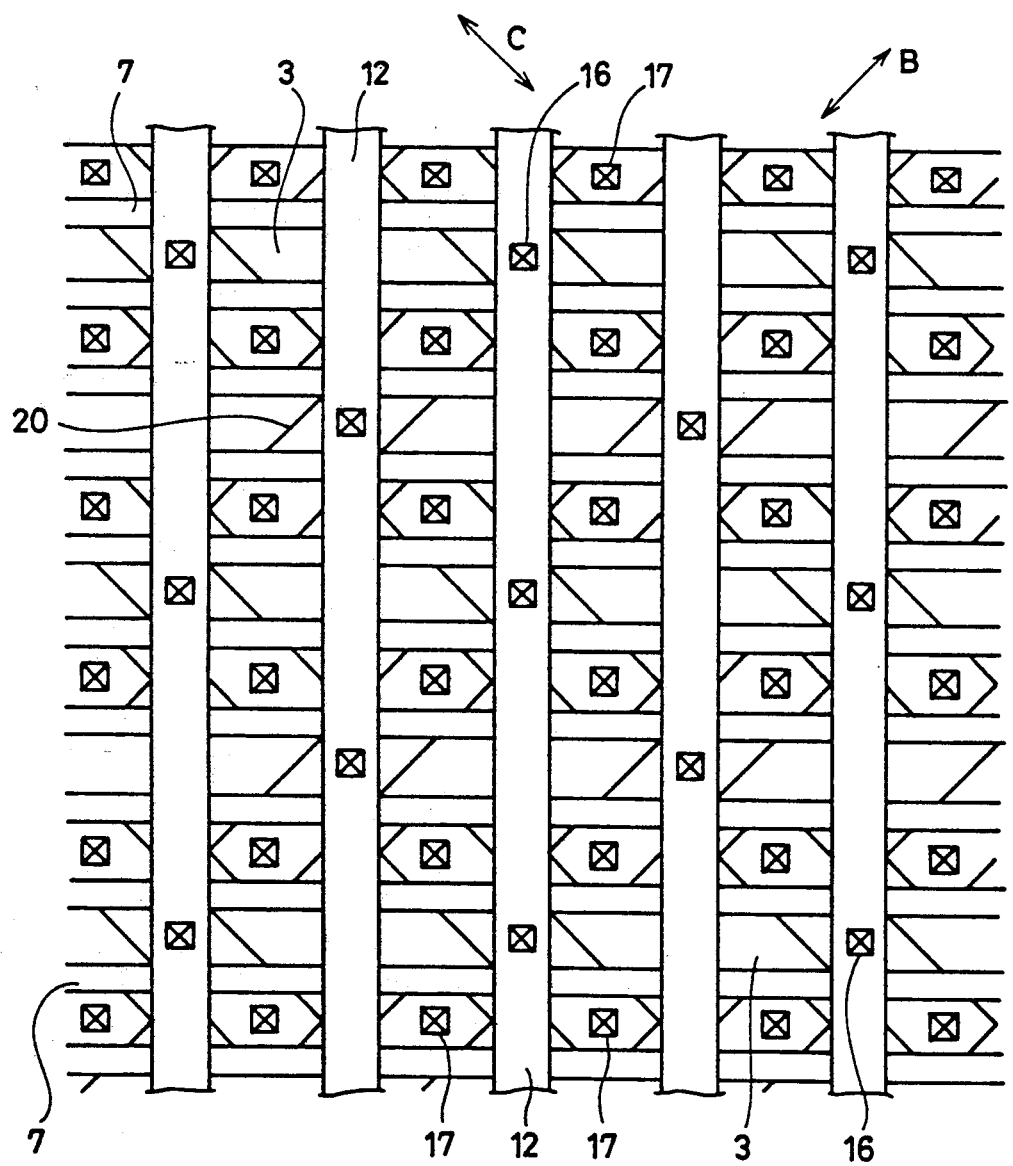
FIG. 4 is a partial plan view showing another example of a plane arrangement of memory cells of a DRAM as a semiconductor device according to the present invention.

Referring to FIG. 4, the plane arrangement of the memory cells is in accordance with the folded bit line structure. The folded bit line structure is one of layout systems of bit lines in a DRAM, in which a pair of bit lines connected to one sense amplifier is arranged in parallel in the same direction. Each memory cell is arranged at every other intersection point of the bit line 12 and the word line 7. According to the folded bit line structure, the active regions 20 are comprised of a group of active regions formed spaced apart at a predetermined interval in a direction shown by the arrow B, and a group of active regions formed spaced apart at a predetermined interval in a direction shown by the arrow C. A storage node is a region surrounded by the word line 7 and the bit line 12 and also extends to a region where no contact hole 17 is formed.

According to the open bit line structure shown in FIG. 1, the contact holes 17 are formed in all the regions surrounded by the word lines 7 and the bit lines 12. Each active region 20 is aligned along a fixed direction A. Therefore, application of the present invention to the open bit line structure enables a layout of memory cells having high density. Also in the folded bit line structure shown in FIG. 4, each active region 20 can be arranged regularly along a predetermined direction B or C.

As described in the foregoing, the active region 20 constituting each memory cell according to the present invention can be arranged in accordance with a pattern having a predetermined regular relation with lattices comprising bit lines 12 and word lines 7 in both of the folded bit line structure and the open bit line structure.

Referring to FIGS. 5A to 5G and FIGS. 6A to 6G, a method of manufacturing a memory cell of the present invention will be described, wherein description will be given to one memory cell.

Figure 5A:
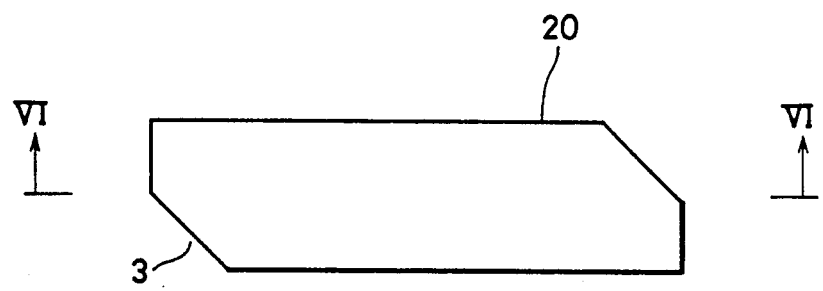
FIGS. 5A, 5B, 5C, 5D, 5E, 5F and 5G are partial plan views showing sequential steps of a method of manufacturing a memory cell of a DRAM according to the present invention.
Figure 6A:
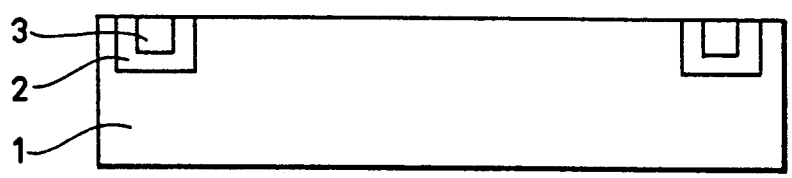
FIGS. 6A, 6B, 6C, 6D, 6E, 6F and 6G are sectional views showing sections taken along lines VI-VI of FIGS. 5A to 5G, respectively.

First, referring to FIG. 5A and FIG. 6A, an isolation field oxide film 3 of a silicon oxide film or the like is formed in order to isolate an active region 20 according to a predetermined pattern. The isolation field oxide film 3 is formed on a p+ impurity diffusion region 2 formed spaced apart in a p type silicon substrate 1.

Figure 5B:
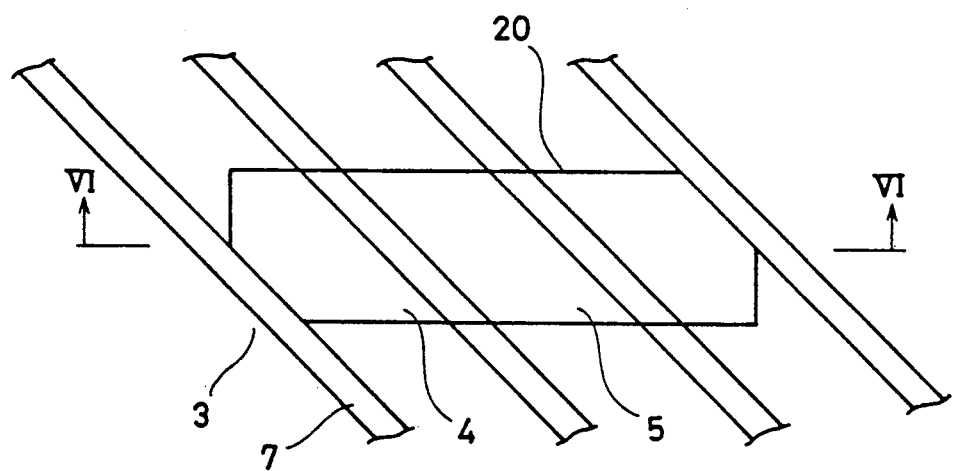
Figure 6B:
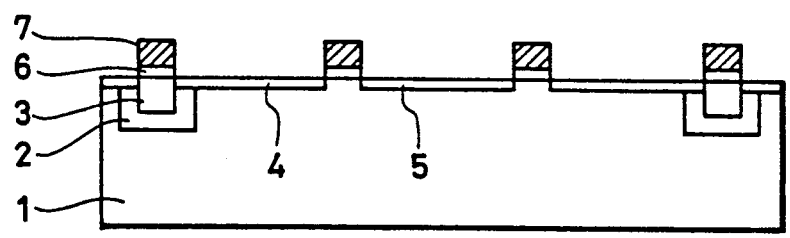

Referring to FIGS. 5B and 6B, a gate oxide film 6 is formed on the p type silicon substrate 1 to extend in a predetermined direction according to a predetermined pattern. A gate electrode 7 is formed of a polycrystalline silicon or the like as a word line on the gate oxide film 6. n+ impurity diffusion regions 4 and 5 which will be source and drain regions are formed by implanting ions of n type impurities to the silicon substrate 1.

Figure 5C:
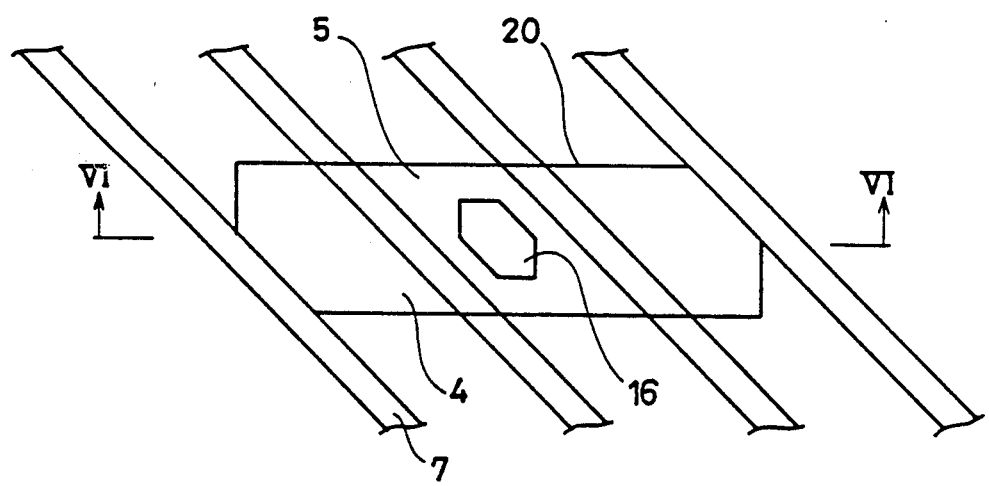
Figure 6C:
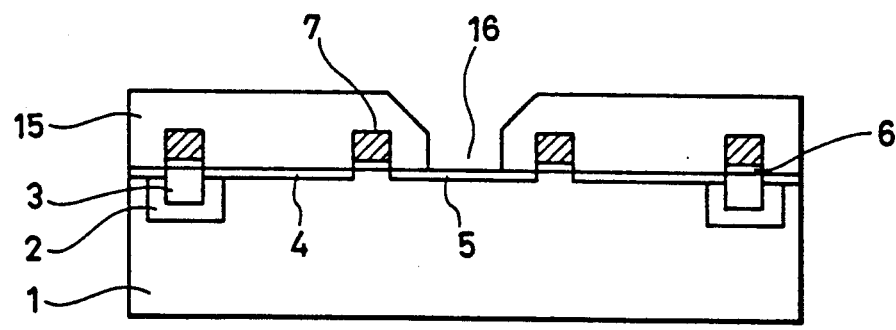

Referring to FIGS. 5C and 6C, after the formation of an interlayer insulating film 15 over the whole surface, a contact hole 16 is formed by etching such that only a surface of the n+ impurity diffusion region 5 is exposed.

Figure 5D:
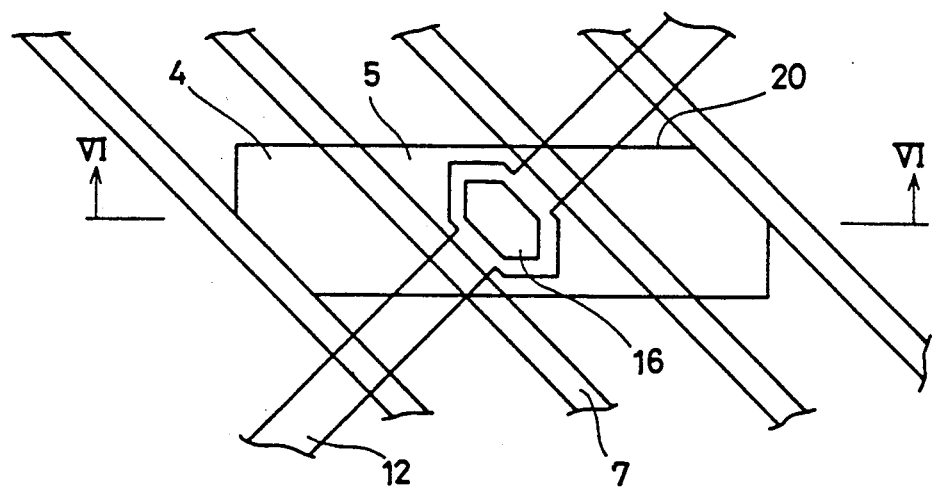
Figure 6D:
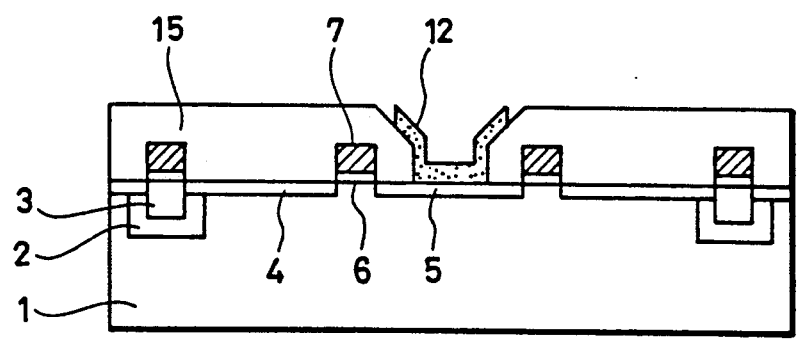

As shown in FIGS. 5D and 6D, a bit line 12 of a polycrystalline silicon layer or the like is formed so as to be electrically contact with the n impurity diffusion region 5 through the contact hole 16. The bit line 12 is formed to be approximately perpendicular to the word line 7 and also to intersect with a direction of the active regions 20.

Figure 5E:
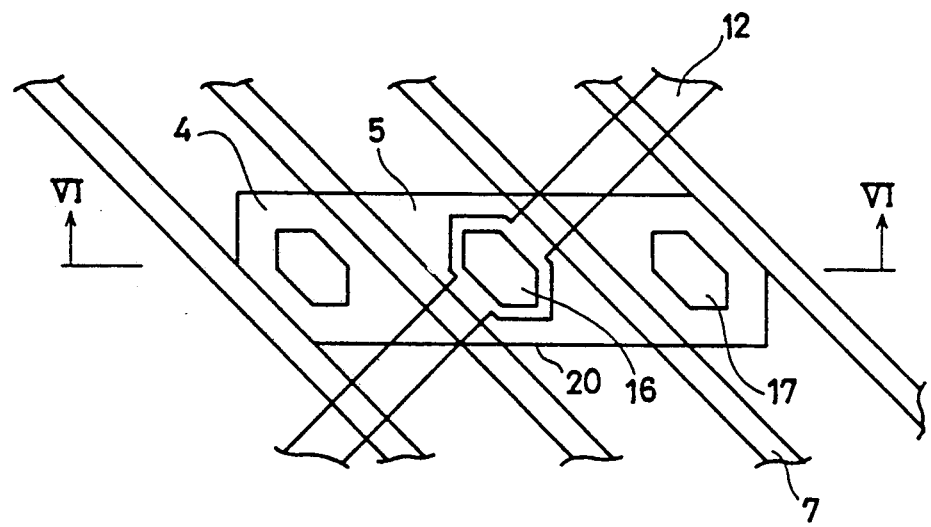
Figure 6E:
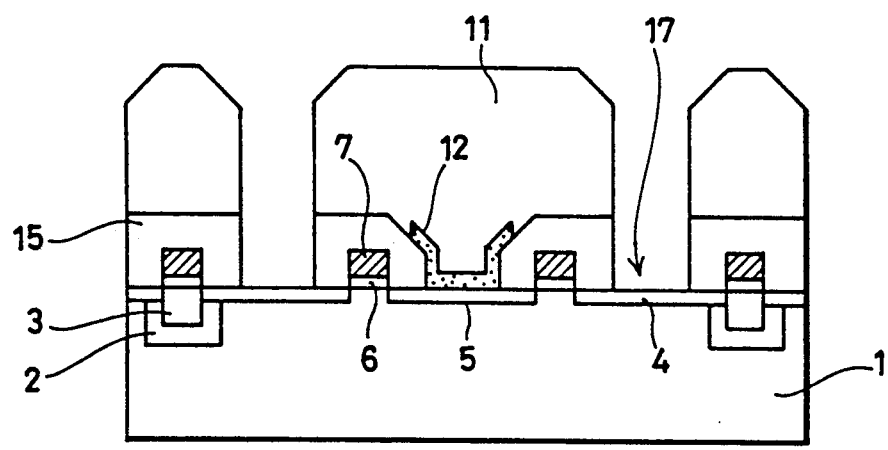

Referring to FIGS. 5E and 6E, an interlayer insulating film 11 formed of a silicon oxide film or the like is formed over the whole surface. Thereafter, a contact hole 17 is formed in the interlayer insulating film 11 by etching such that only a surface of the n+ impurity diffusion region 4 is exposed.

Figure 5F:
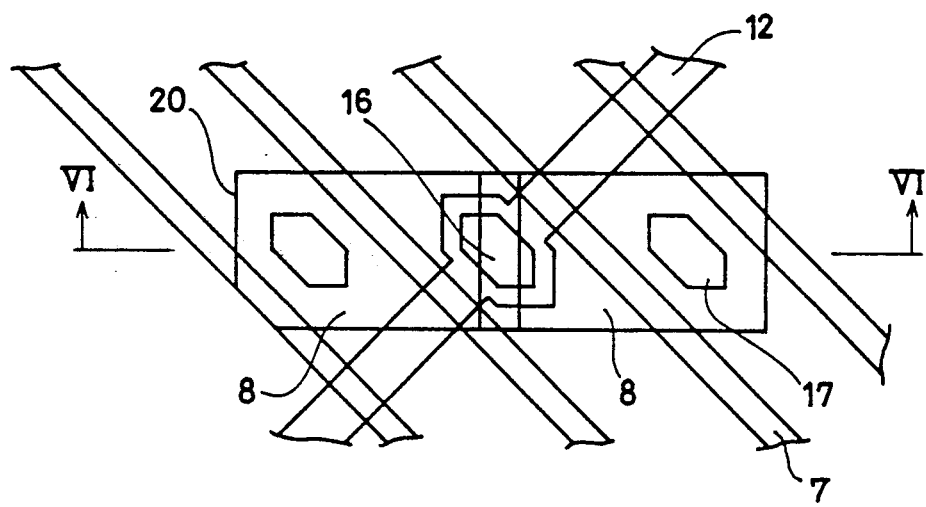
Figure 6F:
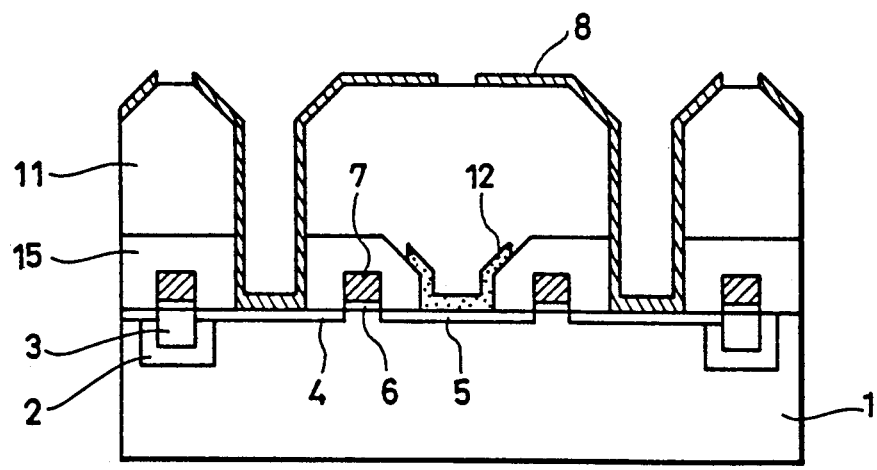

As shown in FIGS. 5F and 6F, a storage node 8 of a polycrystalline silicon or the like is formed to be electrically contact with the n+ impurity diffusion region 4 according to a predetermined pattern. At this time, the storage node 8 is formed on a side surface of the contact hole 17 and an upper surface of the interlayer insulating film 11.

Figure 5G:
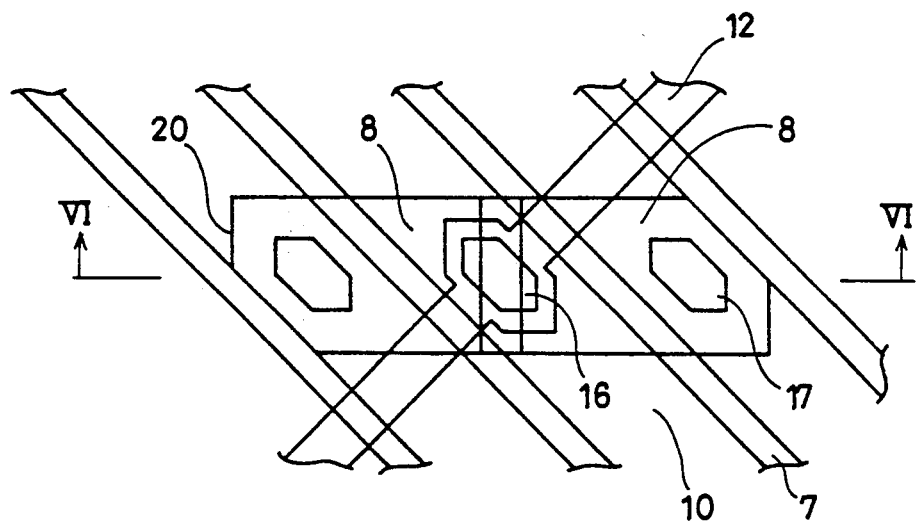
Figure 6G:
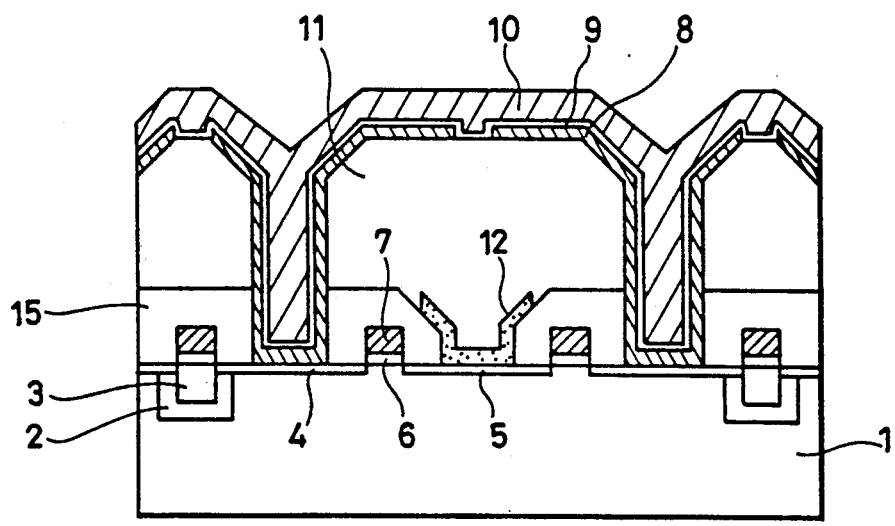
Figure 7:
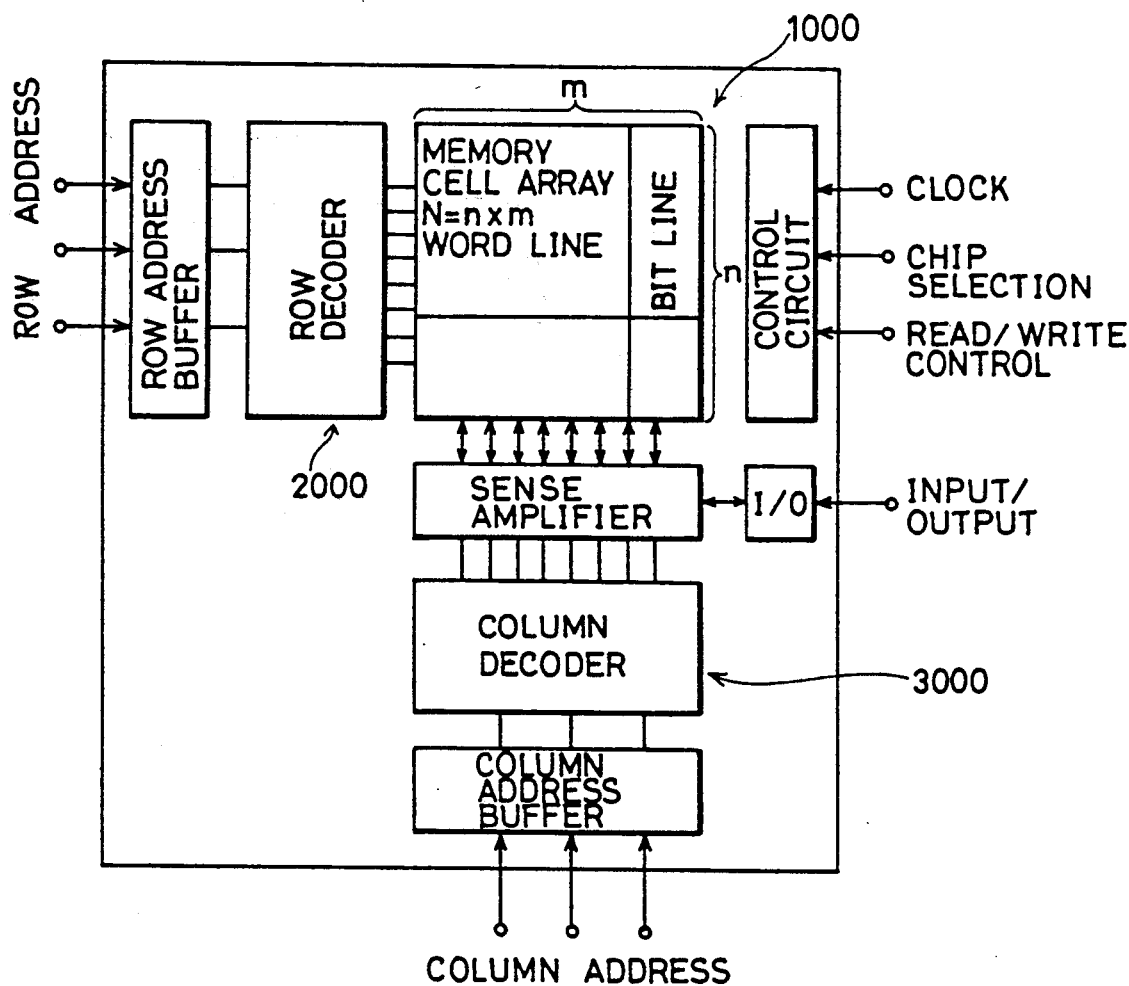
FIG. 7 is a block diagram showing one example of an entire structure of a conventional DRAM.
Figure 8:
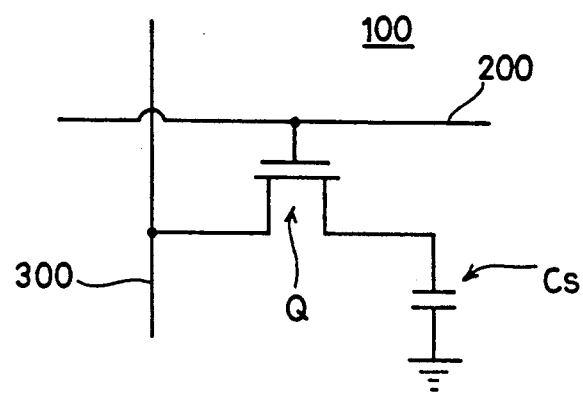
FIG. 8 is an equivalent circuit diagram showing one memory cell of a conventional DRAM.
Figure 9:
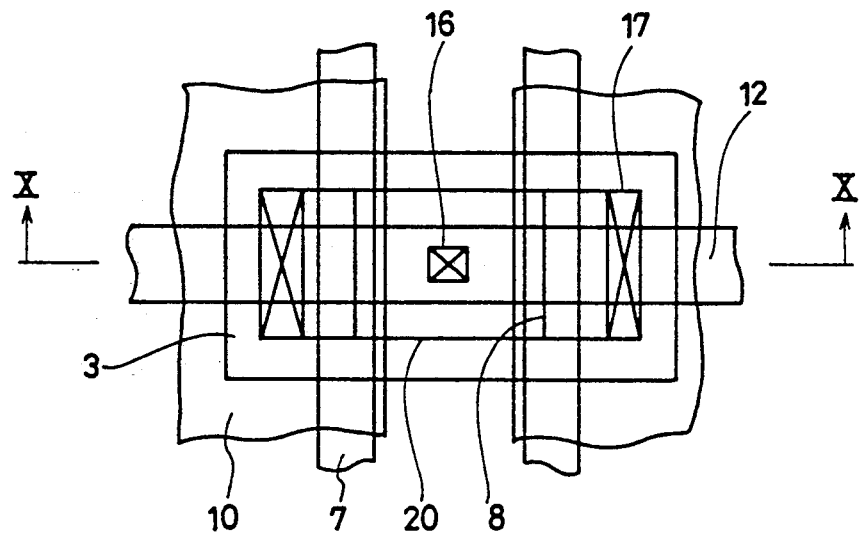
FIG. 9 is a partial plan view showing a plane structure of a memory cell having a conventional stacked capacitor cell.
Figure 10:
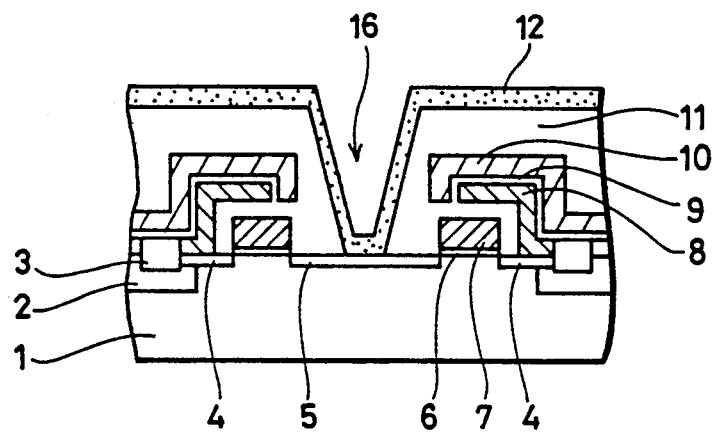
FIG. 10 is a sectional view showing a section taken along a line X—X of FIG. 9.
Figure 11:
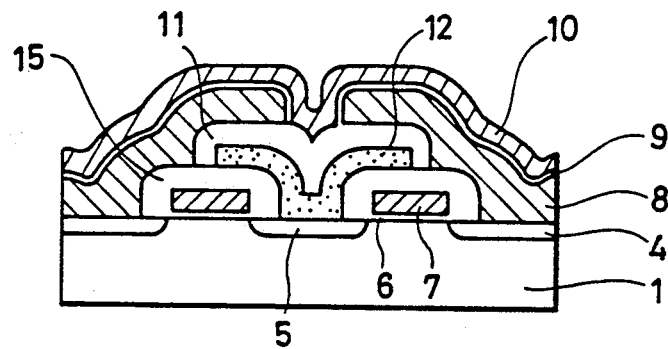
FIG. 11 is a partly sectional view showing one prior art of a structure of a memory cell having a stacked capacitor cell.
Figure 12:
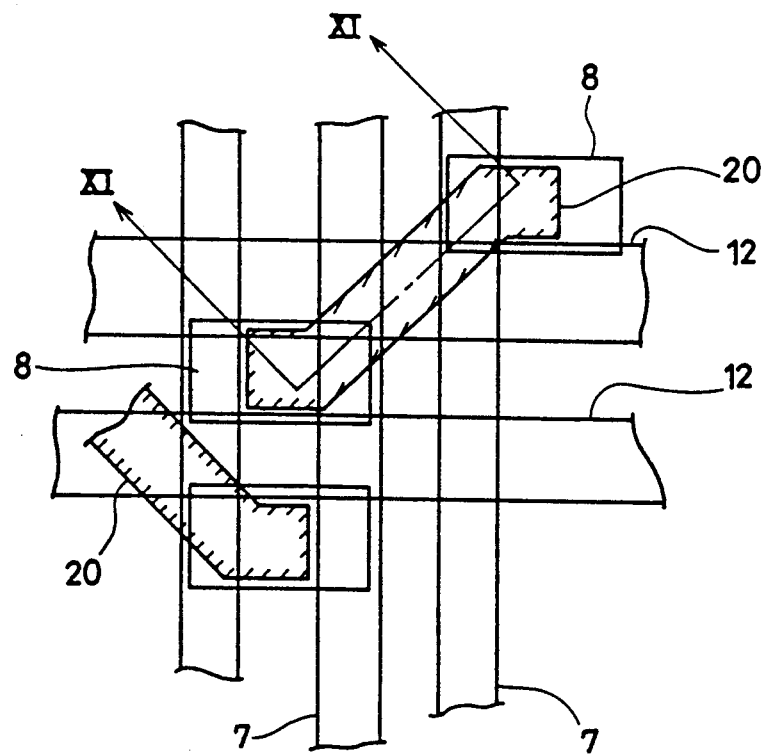
FIG. 12 is a partial plan view showing a plane arrangement of memory cells corresponding to the structure shown in FIG. 11.

Referring to FIGS. 5G and 6G, a capacitor dielectric film 9 of a silicon oxide film or the like is formed covering the storage node 8. A cell plate 10 of a polycrystalline silicon or the like is formed opposing to the storage node 8 on the capacitor dielectric film 9. Thus, a memory cell of a DRAM according to the present invention is formed.

While in the above described embodiments, a capacitor is formed on the bit line 12 through the interlayer insulating film 11, a capacity of the capacitor can be further increased by making a film thickness of the interlayer insulating film 11 thicker. More specifically, the increased film thickness of the interlayer insulating film 11 causes the increase of the surface area of a sidewall of the contact hole 17. The storage node 8 is formed on the sidewall of the contact hole 17. Therefore, a plane area where the storage node 8 is opposed to the cell plate 10 is increased also in a longitudinal direction. Accordingly, by arranging the storage node 8 above the bit line 12, the surface area of the storage node 8 can be further increased also in a lateral direction.

As described in the foregoing, according to the present invention, an active region constituting a memory cell can be formed with a simple pattern layout by arranging a bit line in a lower layer portion of a capacitor portion. Therefore, an active region having a regular pattern layout related to lattices comprising bit lines and word lines can be formed. As a result, in a memory cell of the open bit line structure, a memory cell layout having a high density can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a field effect transistor having one and the other impurity regions formed on a semiconductor substrate, an interconnection layer connected to one of the impurity regions of the field effect transistor, and a capacitor portion connected to the other impurity region and having a stacked structure, comprising:

a semiconductor substrate of a first conductivity type having a major surface, a plurality of word lines formed on said major surface and extending in a first direction, a plurality of bit lines formed on said word lines and extending in a second direction intersecting with said first direction, a plurality of active regions formed on said major surface of the semiconductor substrate and aligned at least at a predetermined interval in a third direction intersecting with said first and second directions, each of said active regions substantially forming a plane rectangle, and a plurality of memory cells arranged at intersection points of said word lines and said bit lines, each of said memory cells comprising,
one and the other impurity regions of a second conductivity type formed spaced apart from each other in said active regions so as to define a channel region with a part of said major surface of said active region being a channel surface,
a gate electrode formed through a gate insulating film on said channel surface so as to be connected with said word lines, said bit line being electrically in contact with said one impurity region and being formed insulated above said gate electrode, an insulation layer formed on said bit lines and said word lines and having a concave opening comprising a bottom surface exposing a surface of said other impurity region and a side surface extending approximately perpendicular to said major surface of the semiconductor substrate, a storage node is formed on said bottom surface of the concave opening and having a bottom wall portion electrically in contact with said other impurity region and a sidewall portion formed on said side surface of the concave opening, a dielectric film on said storage node, and a cell plate formed on said storage node through said dielectric film.

2. A semiconductor memory device according to claim 1, wherein said storage node comprises a portion formed extending on said insulation layer.

3. A semiconductor memory device according to claim 1, wherein said storage node comprises a portion extending in a region surrounded by said word line and said bit line.

4. A semiconductor memory device according to claim 3, wherein said storage node comprises a contact portion electrically in contact with said other impurity region in said extended portion.

5. A semiconductor memory device according to claim 4, wherein said contact portion is arranged so as to be aligned in said first direction.

6. A semiconductor memory device according to claim 5, wherein said contact portion is arranged so as to be aligned in said second direction.

7. A semiconductor memory device according to claim 1, wherein said active regions comprise a first group of active regions and a second group of active regions arranged to be aligned in two directions intersecting with each other, respectively.

8. A semiconductor memory device according to claim 1, wherein said active regions comprise groups of active regions arranged in one direction.

* * * * *